INVENTORS
PATRICK E. LANNAN
MARION L. SNEDEKER
BY Hudson, Boughton,
Williams, David & Hoffmann
ATTORNEYS Aug. 27, 1957 P. E. LANNAN ET AL 2,804,544
TWO BAND LONG LINE SUPERHETERODYNE TUNER USING TWO MODES OF RESONANCE FOR OSCILLATOR LINE
Filed Dec. 11, 1953 3 Sheets-Sheet 2

INVENTORS
PATRICK E. LANNAN
MARION L. SNEDEKER
BY Hudson, Boughton, Williams, David & Hoffmann
ATTORNEYS TWO BAND LONG LINE SUPERHETERODYNE TUNER USING TWO MODES OF RESONANCE FOR OSCILLATOR LINE Filed Dec. 11, 1953 3 Sheets-Sheet 3

INVENTORS
PATRICK E. LANNAN
MARION L. SNEDEKER
BY Hudson, Boughton, Williams, David & Hoffmann
ATTORNEYS

United States Patent Office 2,804,544

Patented Aug. 27, 1957

2,804,544

TWO BAND LONG LINE SUPERHETERODYNE TUNER USING TWO MODES OF RESONANCE FOR OSCILLATOR LINE

Patrick E. Lannan and Marion L. Snedeker, Cleveland, Ohio

Application December 11, 1953, Serial No. 397,639

10 Claims. (Cl. 250—20)

The present invention relates to a tuning apparatus or tuner for selectively receiving radio frequency signals within a wide band and converting the signals to a different frequency, the apparatus being tunable through a wide range of frequencies.

The principal object of the present invention is the provision of a new and improved tuning apparatus which is continuously tunable over a wide range for selectively receiving radio frequency signals and converting the signals to a different or intermediate frequency.

Another object of the present invention is the provision of a new and improved continuously tunable wide band tuning apparatus for selectively receiving radio frequency signals comprising a tuned radio frequency amplifier and a mixer or converter associated with a local oscillator to convert the frequency of the output of the amplifier to a lower frequency, the amplifier, mixer, and oscillator including novel ganged tuning elements comprising coiled, parallel conductor, variable length transmission lines, with the transmission line tuning element of the oscillator being selectively operable as a ¼ or ¾ wave length line.

Another object is the provision of a novel and improved continuously tunable tuning apparatus embodying transmission line tuning elements adapted to selectively receive radio frequency oscillations between 30 mc. and 1,000 mc. whereby the apparatus is especially useful as a television tuner covering both the V. H. F. and U. H. F. television ranges, the transmission line tuning elements operating in the ¼ wave length mode to cover the V. H. F. range and in the ¾ wave length mode to cover the U. H. F. range.

A further object of the present invention is the provision of a new and improved continuously tunable tuning apparatus for receiving radio frequency signals comprising a wide band radio frequency amplifier having a tuned input, the output of the amplifier being coupled through a tuned circuit to the input of a mixer having a local oscillator associated therewith whereby the signal from the amplifier is converted to an intermediate frequency, the input and output circuits of the amplifier and the tuning circuit of the oscillator being tuned by coiled variable length transmission lines, the lines being provided with means permitting the relationship of the lines to be varied for providing the desired tracking of the tuned elements.

The term "tuning apparatus" or "tuner" as used above and hereinafter refers to the means for converting a radio frequency signal to an intermediate frequency and includes a radio frequency amplifier whose output is fed to a mixer where it is beat against the output of a local oscillator. The term "tuning element" is used above and hereinafter to refer to the circuit element, in this case a transmission line, which is used to tune the various circuits of the tuning apparatus. The term "effective length" used in referring to the transmission line tuning elements refers to the length of a corresponding transmission line in free space as will be well understood by those skilled in the art.

Other objects and advantages of the invention will be apparent from the following detailed description of the preferred form of the invention, reference being made to the accompanying drawings forming a part hereof and wherein, Fig. 1 is the circuit diagram of a tuner embodying the present invention;

The present invention contemplates the use of novel coiled transmission lines of variable effective length as tuning elements for the various tuned circuits of the tuning apparatus the lines operating at a different electrical length for different frequency ranges to be covered. The transmission lines are each electrically terminated by electrically conducting means, preferably a shorting member, which is movable along the convolutions of the shorted line while in continuous contact therewith by the rotation of the line to vary the effective length of the line and the frequency to which the line is tuned, thereby providing tuning elements which are particularly suitable for ganging and easily tracked. The ganging of the lines may be accomplished by gearing the lines so that one shorting member is moved the same, a greater, or less distance than the slider on another line to assure the proper relation between the tuned frequencies of the elements. To facilitate tracking the lines themselves may be tapered or constructed with varying pitch or spacing between the convolutions thereof to provide different electrical characteristics for equal angular rotation of the different lines.

Figure 2:
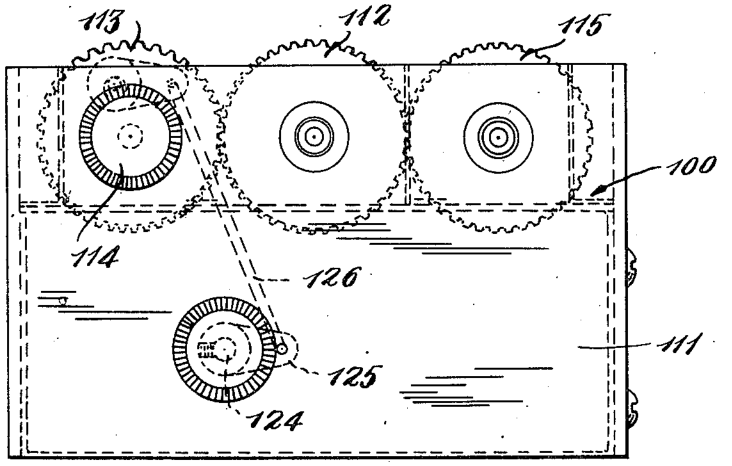
Fig. 2 is a front elevational view of a tuning apparatus embodying the present invention.
Figure 1:
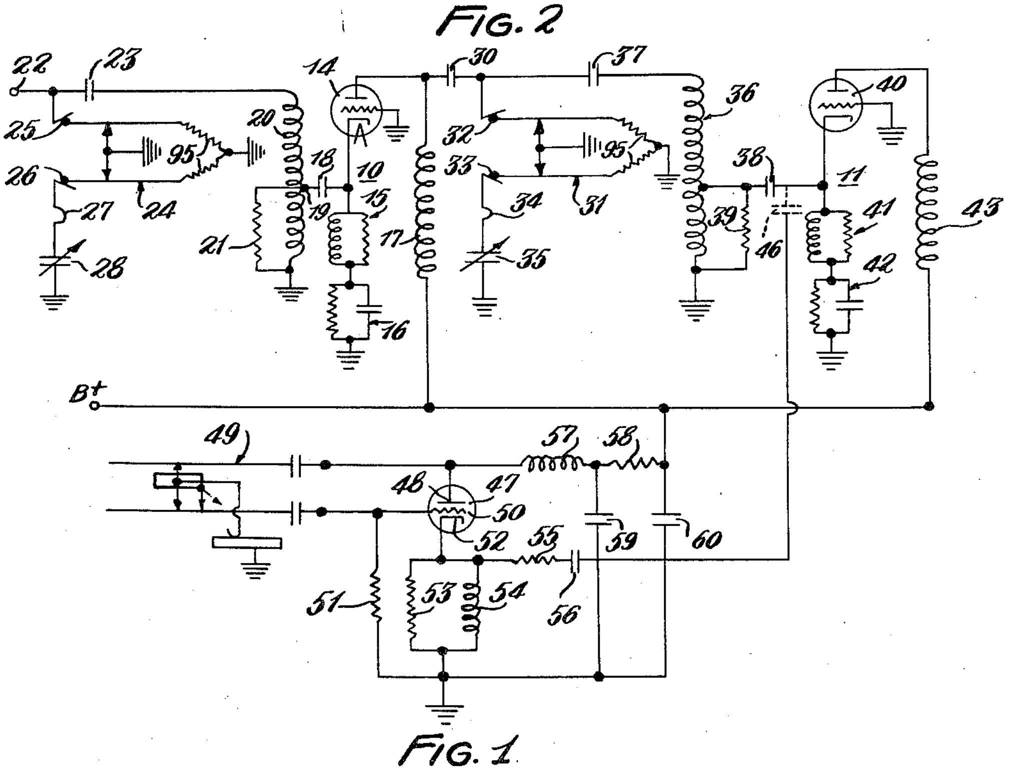
Figure 3:
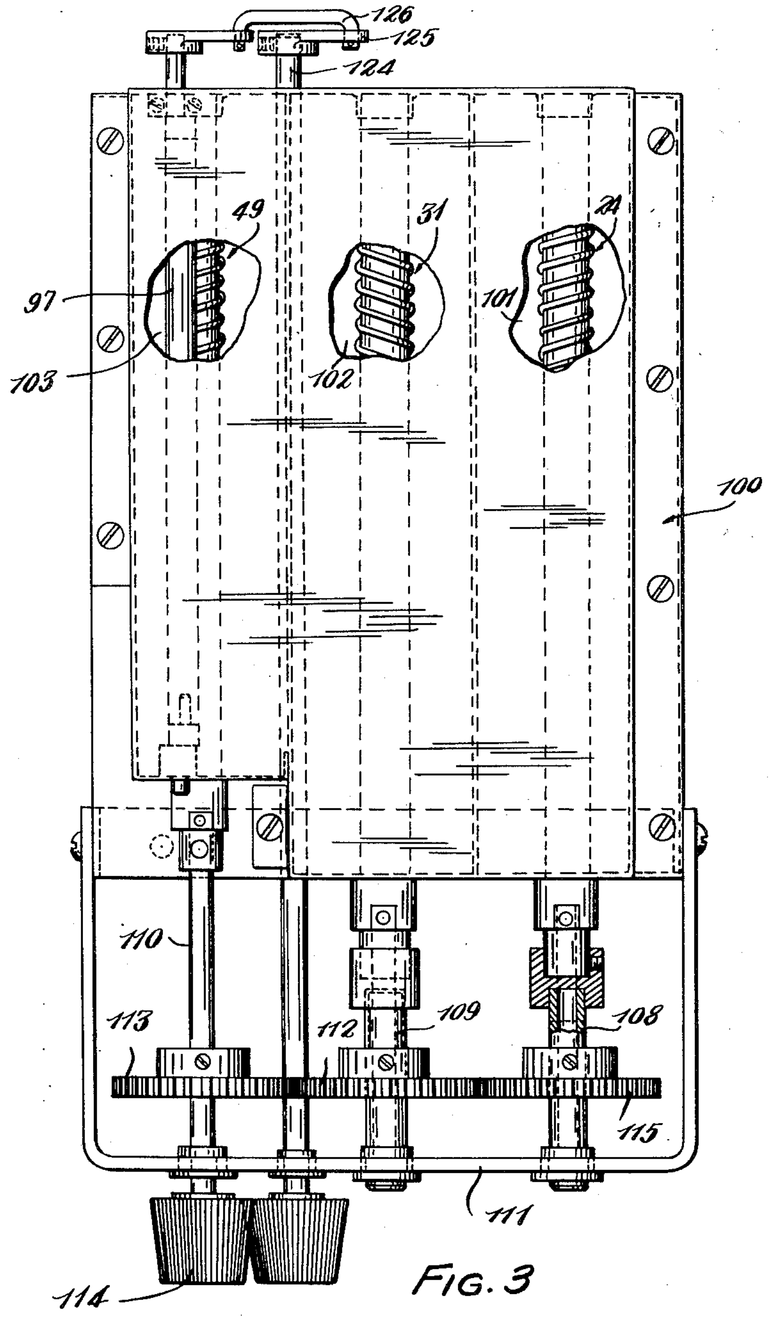
Fig. 3 is a plan view of the tuner shown in Fig. 2 with parts cut away.
Figure 4:
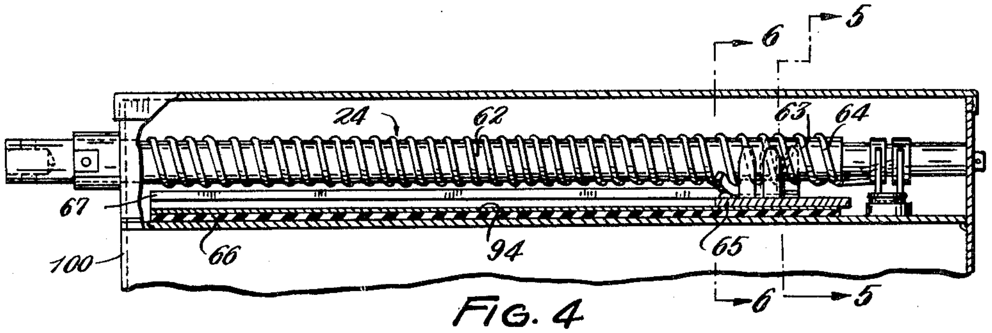
Fig. 4 is a side elevational view of a transmission line tuning element utilized in the tuner of Fig. 2.
Figure 10:
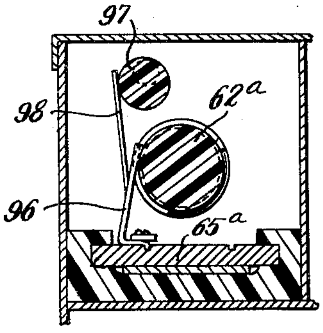
Fig. 10 is a sectional view taken approximately along line 10—10 of Fig. 9.
Figure 5:
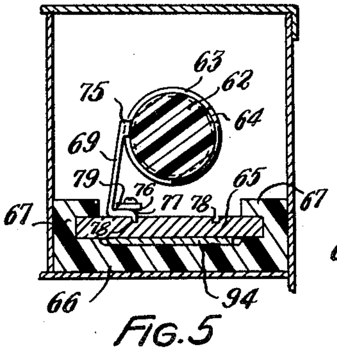
Fig. 5 is an enlarged cross sectional view taken approximately along line 5—5 of Fig. 4.
Figure 6:
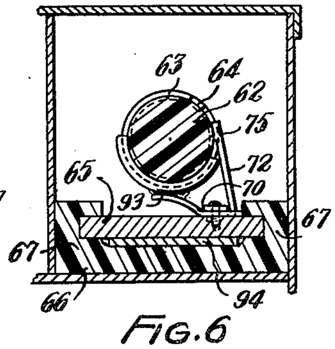
Fig. 6 is an enlarged cross sectional view taken approximately along line 6—6 of Fig. 4.
Figure 8:
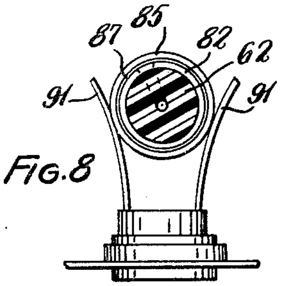
Fig. 8 is a sectional view taken approximately along line 8—8 of Fig. 7.

The electrical circuit diagram of the preferred embodiment of a tuning apparatus embodying the present invention is illustrated in Fig. 1. As shown therein, the apparatus comprises a tuned radio frequency amplifier 10, a mixer 11, and a local oscillator 12. The output of the radio frequency amplifier 10 is applied to the input of the mixer 11 where it beats with the output of local oscillator 12 also applied to the input of the mixer. The output of the mixer 11 is the beat frequency between the output of the radio frequency amplifier 10 and the local oscillator 12.

The radio frequency amplifier 10 suitably comprises a grounded grid vacuum tube triode 14 having its cathode connected to ground through series-connected cathode impedances 15, 16. The cathode impedance 15 comprises an inductance in parallel with a resistor and impedance 16 comprises a resistor in parallel with a capacitor. The plate of triode 14 is connected to the B+ terminal of a suitable power supply through a radio frequency choke 17. The radio frequency choke 17 is adapted to prevent the passage of both U. H. F. and V. H. F. frequencies. The input to the radio frequency amplifier 10 is connected to the cathode of triode 14.

The input to the amplifier 10 is made to the cathode of triode 14 through a condenser 18 having one side connected to the cathode and the other side to the common terminal 19 between the primary and secondary coils of a set-up auto-transformer 20. The other side of the secondary coil of the auto-transformer is connected to ground and a resistor 21 is connected in parallel with the secondary coil. The primary coil of the auto-transformer 20 has its other terminal connected to a R.-F input terminal 22 of the tuner through a condenser 23. The terminal 22 is also connected to ground through a circuit in parallel with the condenser 23 and the auto-transformer 20 comprising a transmission line tuning element 24 utilized as an anti-resonant circuit and having one terminal 25 connected to the radio frequency terminal 22 and the other terminal 26 connected to ground through a series connected inductance loop 27 and variable capacitor 28. The above described circuit for applying R.-F. energy to the amplifier provides tuned circuit means utilizing a coiled transmission line as an anti-resonant circuit.

The plate of the triode 14 of the radio frequency amplifier 10 is connected to ground through a series connected capacitor 30 and transmission line tuning element 31 having terminals 32, 33. The terminal 32 is connected to one side of the capacitor 30 and the terminal 33 is connected to ground through an inductance loop 34 and variable capacitor 35. The terminal 32 of the transmission line tuning element 31 is also connected to the primary coil of an auto-transformer 36 through a condenser 37. The output from the amplifier 10 is taken across the secondary coil of the auto-transformer 36 and is coupled to the input of the mixer through a capacitor 38. The side of the secondary coil of the transformer 36 not connected directly to the primary coil is connected to ground and a resistor 39 is preferably connected across the secondary coil of the transformer. The output circuit of the amplifier including the transmission line 39 which is used as an anti-resonant circuit comprises tuned circuit means for the amplifier output.

Any suitable mixing circuit may be utilized including those embodying vacuum tubes or those utilizing crystals. As illustrated herein the mixer 11 suitably comprises a grounded grid triode 40 having its cathode connected to ground through cathode impedances 41, 42 similar to impedances 15, 16 respectively of the amplifier 10. The plate of the triode 40 is connected to the B+ terminal of a suitable power supply through a radio frequency choke coil 43.

The output from the local oscillator 12 is capacitive coupled to the input of the mixer. A condenser 46 is shown in dotted lines in the circuit diagram for coupling the output of the oscillator to the input or cathode of the mixer since, in actual practice, the coupling may be made by connecting the output of the oscillator directly to the filament of the mixer tube which is in capacitive relationship to the cathode of the tube. If the connection is made in this manner the filament voltage supply connections must of course be isolated from ground with respect to radio frequency energy by suitable chokes located in the filament leads.

The oscillator for supplying the local signal to the mixer 11, comprises a triode 47, having a tuned circuit connected between the plate and grid or control element. The plate 48 of the triode is connected to one terminal of a transmission line tuning element 49 and the grid or control element 50 of the triode is connected to the other terminal of the element 49. The transmission line tuning element 49 determines the frequency of oscillation of the oscillator. The grid 50 of triode 47 is also connected to ground through a grid biasing resistor 51. The cathode 52 of the triode 47 is connected to ground through parallel connected resistor 53 and inductor 54. The output of the oscillator to the mixer 11 is taken from the cathode 52 through a serially connected resistor 55 and a D. C. blocking condenser 56. The oscillator is suitably of the parallel feed type having the plate 48 of the triode 47 connected to the B+ terminal of the power supply through a radio frequency choke 57 and a plate load resistor 58 connected in series in the order mentioned. Each side of the resistor 58 is connected to ground through radio frequency by-pass condensers 59, 60 respectively.

The tuning elements 24 and 31 in the input and output circuits of the radio frequency amplifier 10 are tuned to permit the desired band of frequencies to be amplified by the amplifier and applied to the input of the mixer 11. The amplified signal from the amplifier is beat with the output of the local oscillator to provide an intermediate frequency signal at the mixer output. In a tuning apparatus it is desirable to maintain a constant difference between the mean frequency of the band passed by the radio frequency amplifier and the output signal of the local oscillator so that the frequency of output of the mixer will be constant when no signal is being received. The tuning elements 24, 31, and 49 comprising coiled variable length transmission lines are particularly suitable for ganging and tracking to properly tune the apparatus and assure constant frequency at the output of the mixer when no signal is being received and also provide continuous tuning over a wide range. The tuning elements are similar in construction and a detailed description will be made of only one of the elements. Any difference, however, between the structure of the tuning element described in detail and the other tuning elements will be clearly set forth.

The amplifier input tuning element 24 comprises a rotor 62 of non-conducting material; a parallel conductor transmission line having its opposite sides formed by wires 63, 64 respectively and wound, preferably in the form of a double threaded helix, on the rotor 62; and a shorting member, suitably a metal slider 65, mounted below the rotor 62 for electrically terminating one end of the line. The parallel wire transmission line is uninsulated and is so wound on the rotor that the adjacent convolutions of the line are formed by the opposite sides of the line. The slider 65 is slidably mounted in a channel block 66 located beneath the rotor for movement longitudinally with respect to the rotor. The channel block has spaced parallel side walls 67 which extend upwardly and then inwardly to form a channel adapted to receive the slider 65.

The slider 65 is provided with a plurality of spring fingers 69, 70, 71 and 72, adapted to engage the convolutions of the wound parallel wire transmission line for electrically connecting the slider across the line. The fingers are each mounted on, and electrically connected to, the slider 65, two of the fingers being located on one side of the rotor 62 and two of the fingers on the other side. The outer end of each finger is provided with a nib 75 which is concave on its side adjacent the rotor 62 which engages the wire of the parallel wire transmission line. The lower portion of each finger is bent to define an acute angle with leg portion to provide a base portion 76 including a depending portion 77 at the outer end of base portion 76. The included acute angle is such as to provide spring bias for urging the nibs 75 into contact with the transmission line. The depending portion 77 is received by one of two spaced parallel grooves 78 in the slider 65 which run lengthwise thereof. The fingers 69, 70, are tied together and clamped in place by a conductive strap 79 fixed to the slider 65 and engaging the top of the base portions 76 of the fingers. The fingers 71 and 72 are similarly secured by a second strap 70.

The fingers in the preferred embodiment engage successive convolutions of the transmission line. The fingers 69 and 70 engage wires 63, 64 respectively at points which are equidistant from the open end of the transmission line, providing a short-circuit between these points producing a shorted transmission line balanced to ground. The fingers 71 and 72 are provided to back the short-circuit caused by the finger 69 and the finger 70 and lends stability to the use of the transmission line as a tuning element. Additional backing fingers may be used if so desired.

Figure 7:
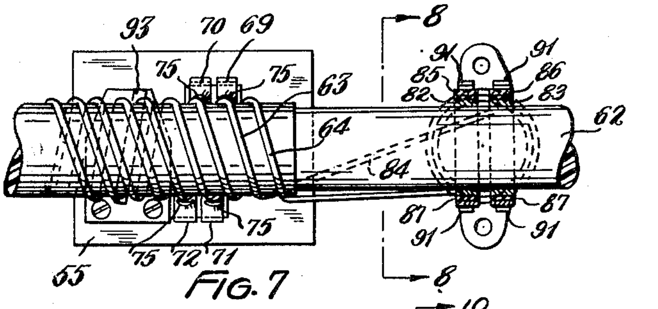
Fig. 7 is an enlarged fragmentary plan view of a portion of the transmission line tuning element of Fig. 4.

The open end of the transmission line is connected to conductive rings 82, 83 mounted on the right hand end of rotor 62 as it is viewed in Fig. 7. The wire 63 of the transmission line engaged by finger 69 is connected to the farther ring 83 and the wire 64 engaged by the fingers 70, 72 is connected to the closer ring 82. In order to enable the wire 63 of the transmission line to be connected to ring 83 without making electrical contact with the other wire 64 or with the ring 82, the rotor 62 is drilled to provide a passage 84 for the wire 63. Rings 85, 86 concentric with the rings 82, 83 respectively and separated therefrom by a dielectric material 87 provide means for making external connection to the transmission line through condensers formed by the respective sets of rings. The dielectric material 87 may be that sold under the trade name of "Teflon" or any other suitable dielectric so that the concentric rings function as a condenser. Each ring 85, 86 is engaged by two brushes 91, located on opposite sides of the rotor 62. The brushes are connected to the terminals of the tuning element.

The slider 65 is provided with an arcuate driver 93 which is adapted to fit between the adjacent convolutions of the transmission line. The driver 93 is supported on the slider 65 so that it is located between convolutions of the transmission line shorted by the spring fingers. As the rotor 62 is rotated the transmission lines act as a double-threaded lead screw and cause the driver 93 to move the slider 65 along the convolutions of the transmission line varying the distance of the shorting fingers from the open end of the line. If desired the nibs 75 on the fingers could be so constructed as to furnish the driving power for the slider as the rotor is rotated. In order to assure that the convolutions of the transmission line do not shift, the rotor 62 is preferably grooved and the convolutions recessed therein.

The slider 65 preferably engages a plate 94 at ground potential which, in the illustrated embodiment, is recessed in the bottom channel in the channel block 66. With this construction the transmission line is balanced to ground.

When the slider 65 is close to the open end of the transmission line providing a relatively short length transmission line, coupling between the shorted and non-shorted turns of the transmission line tends to set up standing waves along the shorted portion of the line. The effect of these waves is preferably minimized by connecting the short-circuited end of the wires 63, 64 to ground through resistors 95, as illustrated in the circuit diagram shown in Fig. 1. The values of the resistor are such as to properly terminate the line.

The construction of the transmission line tuning element 31 providing a tuned circuit between the amplifier in the mixer is the same as the transmission line tuning element 24 just described and the description will not be repeated.

Figure 9:
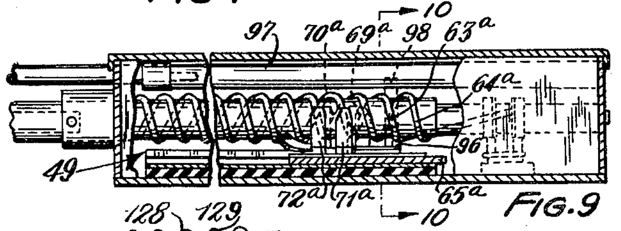
Fig. 9 illustrates a modified form of a transmission line tuning element embodying the present invention.

The transmission line tuning element 49 which determines the frequency of oscillation of the oscillator is designed so that it can be made to operate as a quarter wave length line to provide the necessary local oscillator frequencies for one receiving range and as a three-quarter wave length line so as to provide the necessary local oscillator frequencies for a higher receiving range. The transmission line 49 is similar to the transmission lines of tuning elements 24, 31 but is provided with means to cause the line to operate as an unbalanced transmission line thereby causing the line to function as a three-quarter wave length line in determining the frequency of oscillation of the oscillator. The transmission line tuning element 49, as shown in Fig. 9, comprises a non-conducting rotor 62a having conductors or wires 63a, 64a wound thereon, preferably in the form of a double threaded helix, the wires constituting a parallel conductor transmission line similar to the transmission line 18, 25 described above. Electrical conducting means comprising a metallic slider 65a having electrically conductive spring fingers 69a, 70a, 71a, 72a and 96 is adapted to engage the convolutions of the parallel wire transmission line for terminating the line. The fingers 69a, 70a, 71a, 72a function in the same manner as the fingers 69, 70, 71, 72 respectively of the transmission line tuning element 24, the fingers 69a, 70a engaging adjacent convolutions of the transmission line to connect the opposite sides of the line at points equidistant from the open end and the fingers 71a, 72a providing a backing for the short circuits caused by fingers 69a, 70a. The finger 96 is similar in construction to the other described fingers and is mounted on the slider 65a so as to selectively engage one wire of the transmission line at a point which is a different distance from the open end of the line than the points at which the fingers 69a, 70a engage the line. In the preferred and illustrated embodiment the finger 96 engages the wire at a point closer to the open end of the line than the finger 69a engages the wire 63a. Therefore, when the finger 96 is in contact with the transmission line the line operates as an unbalanced transmission line and functions in the three-quarter wave length mode in determining the frequency of oscillation of the oscillator. It may now be seen that the finger 96 determines the frequency range in which the oscillator oscillates and provides a means for using the oscillator to provide local oscillator frequencies for two different receiving ranges.

The transmission line tuning element 49 is provided with means to engage and disengage the finger 96 from the transmission line comprising a cam rod 97 mounted above the rotor 62a with the length of the rod parallel to the length of the rotor. The cam rod 97 is adapted to bear upon an extension 98 extending upwardly from the finger 96 and providing an operative connection between the finger 96 and the cam rod. The cam rod may be rotated to cause engagement or disengagement of the finger 96 and the wire 64a.

The driving mechanism for the slider 65a and the means for connecting the transmission line tuning element 49 into the external circuit are the same as that of the transmission line tuning element 24 and the description thereof will not be repeated.

When the tuner is used as a television tuner, the transmission line tuning elements 24, 31 are so constructed that they operate as ¼ wave length lines to tune the mixer and the amplifier to the frequencies lying within the V. H. F. television range, and as three-quarter wave length lines to receive frequencies in the U. H. F. range. When the sliders 65, 65a are in the proper position to tune the transmission line tuning elements and consequently the tuner to receive and convert the highest frequency V. H. F. channel to the desired intermediate frequency the sliders will also be in the approximate position for receiving the highest frequency U. H. F. channel, the transmission lines in the former case functioning as quarter wave length lines and in the latter case as three-quarter wave length lines. The actual frequency which is received and converted to the desired intermediate frequency by the tuner will be determined by the position of the finger 96 on the transmission line tuning element for the oscillator. If the finger 96 is engaged, i. e. if the transmission line tuning element of the oscillator is functioning as a three-quarter wave length line, the tuner will receive and convert the frequencies in the U. H. F. range to the desired intermediate frequency while if the finger 96 is disengaged from the transmission line tuning element of the oscillator the tuner will accept and convert those frequencies in the V. H. F. range and reject other frequencies.

The three tuning elements 24, 31, 49 are suitably mounted in a frame or housing 100 having three longitudinal spaces 101, 102, 103 defined by four spaced longitudinal walls 104 in which the elements 24, 31, 49 are located. The rotors 62, 62a of the tuning elements 24, 31, 49 are respectively connected to shafts 108, 109, 110, which extend axially of the rotors through a plate 111 carried by the front of housing or frame 100. The shafts 109 and 110 are geared together by continuously meshed gears 112, 113 mounted on shafts 109, 110 respectively, and preferably having a 1:1 ratio so that the rotors of tuning elements 31, 49 are rotated equal angular amounts. The shaft 110 is provided with a manual control knob 114. The shaft 108 is rotated by a gear 115 mounted on the forward end of the shaft and continuously in mesh with gear 112, the gears 112, 115 preferably having a 1:1 ratio. The pitch of transmission line of tuning element 31 is opposite that of the lines of elements 24, 49 to cause all sliders to move in the same direction on rotation of knob 114. Idler gears could be used instead of reversing the pitch if so desired.

The housing of frame 100 also journally supports a shaft 124 which extends the length of the housing under the elements 31 and 49 and projects from the front and rear of the housing. The rear end of shaft 124 is provided with a crank 125 connected to an arm 126 on the cam rod 97 journally supported above the rotor 62. Rotation of the shaft 124 causes the cam rod 97 to engage or disengage the finger 96 to control the operating mode of the transmission line as hereinbefore explained.

Figure 11:
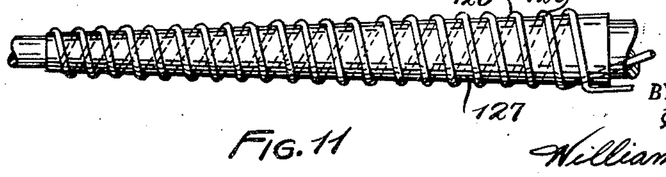
Fig. 11 is an elevational view of a modified rotor and transmission line suitable for use in the present invention.

Tracking of the transmission lines used as tuning elements of the various components of the tuner may be accomplished by utilizing tapered transmission lines, as illustrated in Fig. 11, as the tuning elements in the various circuits. The construction of such a transmission line tuning element may be the same as the transmission line tuning elements above with the exception that the rotor is tapered and the transmission line is spirally wound thereon to provide the desired tracking. The transmission line tuning element shown in Fig. 11 comprises a tapered non-conducting rotor 127 having parallel conductors or wires 128, 129 wound thereon. The wires are adapted to be electrically connected and the transmission line terminated by movable electrical conducting means, preferably a shorting member comprising a slider not illustrated but similar in construction to the slider 65. It will be understood by those skilled in the art that the taper or the rotor is such as to cause the transmission line tuning elements for the amplifier and mixer to track the transmission line tuning element for the oscillator to provide a substantially I. F. at the output of the mixer of substantially constant frequency when no signal is being received.

It will be seen from the above that the present invention provides a continuously tunable apparatus for selectively receiving signals in both the U. H. F. and V. H. F. television ranges. The tuning elements involved in the tuning apparatus are transmission lines of variable effective length which are tunable by the rotation of the lines making them especially suitable for ganging which is necessary in a tuning apparatus of the type described. It is possible to cause the various tuning elements to track each other by use of various gear ratios or by constructing the lines so that equal movements of the slider or shorting member along the convolutions of the line will increase or decrease the resonant wave length of the various lines different amounts. This may be done as hereinbefore mentioned by varying the spacing of the wires of the transmission line, the pitch of the convolutions, the size wires used or by tapering the lines. The capacitors 28, 35 in the connections from the lines of the elements 24, 31 to ground may be varied to provide a fine adjustment when adjusting to obtain proper tracking. The lines may also be "foreshortened" by use of magnetic material embedded in the rotor to increase the distributed inductance of the line for a certain portion of its length and therefore introduce a greater change in electrical characteristics of line per unit movement of the slider as will be well understood by those skilled in the art.

Although the preferred embodiment of the present invention has been illustrated and described herein to a detailed extent, it will be understood of course, that the invention is not to be regarded as being correspondingly limited in scope but includes all changes and modifications coming within the spirit of the invention and the scope of the claims hereof.

Having thus described our invention, we claim:

1. An apparatus of the character described for receiving radio frequency oscillations within a first frequency range and radio frequency oscillations within a second frequency range of higher frequencies than the first range comprising a mixing circuit, a tuned circuit having a first transmission line tuning element and connected to the input of said mixing circuit for applying an input signal thereto, an oscillator having its output connected to the input of said mixing circuit whereby the output of said mixing circuit is the beat frequency of said oscillator output and said input signal, a second transmission line tuning element connected into the tuning circuit of said oscillator for determining the frequency of oscillation of said oscillator, each of said tuning elements comprising a two conductor transmission line and electrically conducting means for terminating the transmission line as a balanced line connected between the opposite sides of the line and movable therealong to vary the effective length of the line, electrically conducting means connected to the means for terminating the second transmission line for unbalancing said second transmission line tuning element thereby causing said second transmission line tuning element to operate in a first mode and said second transmission line operating in a second mode when balanced to tune said oscillator to the proper frequency when said apparatus is to receive signals within said first range and in the first mode when unbalanced to tune said oscillator to the proper frequency when said apparatus is to receive a signal having a frequency in the higher range, and means ganging the movable electrically conducting means of said lines for movement in a predetermined relation to maintain a predetermined intermediate frequency at the output of said mixing circuit throughout the range of frequencies to be received.

2. An apparatus of the character described for receiving radio frequency oscillations within a first frequency range and radio frequency oscillations within a second frequency range of higher frequencies than the first range comprising a mixing circuit, a tuned circuit having a first transmission line tuning element and connected to the input of said mixing circuit for applying an input signal thereto, an oscillator having its output connected to the input of said mixing circuit whereby the output of said mixing circuit is the beat frequency of said oscillator output and said input signal, a second transmission line tuning element connected into the tuning circuit of said oscillator for determining the frequency of oscillation of said oscillator, each of said tuning elements comprising a two conductor transmission line and short circuiting means for terminating the line as a balanced line connected between the opposite sides of the line and movable therealong to vary the effective length of the line, electrically conducting means connected to the short circuiting means for the transmission line of the second tuning element for terminating the transmission line as an unbalanced transmission line, said second transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range, said first element operating as ¼ wave length lines to receive frequencies in the first range and a ¾ wave length lines to receive frequencies in the second range for any given position of the short-circuiting means thereof, and means ganging the movable electrically conducting means of said lines for movement in a predetermined relation to maintain a predetermined intermediate frequency at the output of said mixing circuit throughout the range of frequencies to be received.

3. An apparatus of the character described for receiving radio frequency oscillations within a first frequency range and radio frequency oscillations within a second frequency range of higher frequencies than the first range comprising a mixing circuit, a tuned circuit including a first transmission line tuning element and connected to the input of said mixing circuit for applying an input signal thereto, an oscillator having its output connected to the input of said mixing circuit whereby the output of said mixing circuit is the beat frequency of said oscillator output and said input signal, a second transmission line tuning element connected into the tuning circuit of said oscillator for determining the frequency of oscillation of said oscillator, each of said tuning elements comprising a rotor of non-conducting material and a two conductor transmission line coiled on the rotor with the opposite sides of the transmission line and adjacent convolutions of the coil being formed by different conductors, and electrically connecting means for terminating the transmission line as a balanced line connected between the opposite sides of the line and movable therealong to vary the effective length of the line, said electrically conducting means of said second tuning element including electrically conducting means for selectively terminating the line as an unbalanced transmission line said second transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range, said first tuning element operating as ¼ wave length lines to receive frequencies in the first range and as ¾ wave length lines to receive frequencies in the second range, and means interconnecting the rotors of said tuning elements to cause the electrically conducting means of said lines to move in a predetermined relation upon the rotation of said line to maintain a predetermined intermediate frequency at the output of said mixing circuit throughout the range of frequencies to be received.

4. An apparatus of the character described for receiving radio frequency oscillations within a first frequency range and radio frequency oscillations within a second frequency range of higher frequencies than the first range comprising a mixing circuit, a tuned circuit including a first transmission line tuning element and connected to the input of said mixing circuit for applying an input signal thereto, an oscillator having its output coupled to the input of said mixing circuit whereby the output of said mixing circut is the beat frequency of said oscillator output and said input signal, a second transmission line tuning element connected into the tuning circuit of said oscillator for determining the frequency of oscillation of said oscillator, each of said tuning elements comprising a rotor, a two conductor transmission line coiled on said rotor, the opposite sides of each of said transmission lines and alternate convolutions of each of the coils being formed by different conductors, electrically conducting means for terminating each of said lines as a balanced line connected between the opposite sides of the line and movable therealong upon the rotation of the rotor to vary the effective length of the lines, each of said electrically conducting means comprising first and second conducting fingers for engaging the conductors of the transmission line, said electrically conducting means of said second tuning element including a third conductive finger connected to the means for terminating the transmission line thereof and selectively engageable with one of the conductors of the line to unbalance said second transmission line tuning element, said second transmission line tuning element operating in a first mode when balanced to tune said oscillator to the proper frequency when said apparatus is to receive signals within said first range and in a second mode when unbalanced to tune said oscillator to the proper frequency when said apparatus is to receive a signal having a frequency in the higher range, said first tuning element operating in said first mode to receive frequencies in the first range and in said second mode to receive frequencies in the second range, and means interconnecting said rotors for moving the movable electrically conducting means of said lines upon rotation of said rotors in a predetermined relation to maintain a predetermined intermediate frequency at the output of said mixing circuit throughout the range of frequencies to be received.

5. An apparatus of the character described for receiving radio frequency oscillations within a first frequency range and radio frequency oscillations within a second frequency range of higher frequencies than the first range comprising a mixing circuit, a tuned circuit connected to the input of said mixing circuit and including a first transmission line tuning element, an oscillator having its output coupled to the input of said mixing circuit whereby the output of said mixing circuit for the beat frequency of said oscillator output and the said tuned input of said mixing circuit, a second transmission line tuning element connected into the tuning circuit of said oscillator for determining the frequency of oscillation of said oscillator, each of said tuning elements comprising a rotor, a two conductor transmission line coiled on said rotor, the opposite sides of the transmission line and alternate convolutions of the coil being formed by different conductors, and electrically conducting means for terminating the transmission line as a balanced line connected between the opposite sides of the line and movable therealong to vary the effective length of the line, the electrically conducting means for terminating the transmission line of said second tuning element including means to unbalance the transmission line tuning element and cause said second transmission line tuning element to operate as a ¾ wave length line, said third transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range, said first tuning element operating as ¼ wave length lines to receive frequencies in the first range and as ¾ wave length lines to receive frequencies in the second range, and means interconnecting said movable electrically conducting means of said lines for movement in a predetermined relation to maintain a predetermined intermediate frequency at the output of said mixing circuit throughout the range of frequency to be received, the rotor of said first transmission tuning element being tapered to facilitate tracking of said tuning elements.

6. An apparatus of the character described for receiving radio frequency oscillations within a first frequency range and within a second frequency range of higher frequencies than the first range comprising a radio frequency amplifier; a mixing circuit; a local oscillator; tuned circuit means including a first transmission line tuning element for connecting a radio frequency signal to the input of said amplifier; tuned circuit means including a second transmission line tuning element for connecting the output of said amplifier to the input of said mixer; a third transmission line tuning element connected into the tuning circuit of said oscillator to determine the frequency of oscillation of said oscillator; circuit means connecting the output of said oscillator to the input of said mixing circuit whereby the output of said mixing circuit is the beat frequency of said amplifier output and said oscillator output; each of said tuning elements comprising a two conductor transmission line, and electrically connecting means for terminating the line as a balanced line connected between the opposite sides of the line and movable therealong to vary the effective length of the line; the means for terminating said third tuning element including electrically conductive means for terminating the transmission line of said third tuning element as an unbalanced transmission line and to cause said third transmission line tuning element to operate in a first mode, said third transmission line tuning element operating in a second mode when balanced to tune said oscillator to the proper frequency and said first and second tuning elements operating in said second mode to receive frequencies in the first range and in said first mode to receive frequencies in the second range; and means ganging said movable electrically conducting means of said lines for movement in a predetermined relation to maintain a predetermined intermediate frequency at the output of said mixing circuit throughout the range of frequencies to be received.

7. An apparatus of the character described for receiving radio frequency oscillations within a first frequency range and within a second frequency range of higher frequencies than the first range comprising a radio frequency amplifier; a mixing circuit; a local oscillator; tuned circuit means including a first transmission line tuning element for connecting a radio frequency signal to the input of said amplifier; tuned circuit means including a second transmission line tuning element for connecting the output of said amplifier to the input of said mixer; a third transmission line tuning element connected into the tuning circuit of said oscillator to determine the frequency of oscillation of said oscillator; circuit means connecting the output of said oscillator to the input of said mixing circuit whereby the output of said mixing circuit is the beat frequency of said amplifier output and said oscillator output; each of said tuning elements comprising a coiled two conductor transmission line, the opposite sides of the transmission line and alternate convolutions of the coil being formed by different conductors and short-circuiting means for terminating the transmission line as a balanced line connected between the opposite sides of the line and movable therealong upon the rotation of the line to vary the effective length of the line; said electrically conductive means for terminating the transmission line of said third element including means to unbalance said third transmission line tuning element and cause said third transmission line tuning element to operate as a ¾ wave length line, said third transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range and said first and second tuning elements operating as ¼ wave length lines to receive frequencies in the first range and as ¾ wave length lines to receive frequencies in the second range, and means interconnecting the short-circuiting means of said lines for movement in a predetermined relation to maintain a predetermined intermediate frequency at the output of said mixing circuit throughout the range of frequencies to be received.

8. An apparatus of the character described for receiving radio frequency oscillations within a first frequency range and within a second frequency range of higher frequencies than the first range comprising a radio frequency amplifier; a mixing circuit; a local oscillator; tuned circuit means including a first transmission line tuning element for connecting a radio frequency signal to the input of said amplifier; tuned circuit means including a second transmission line tuning element for coupling the output of said amplifier to the input of said mixer; a third transmission line tuning element connected into the tuning circuit of said oscillator to determine the frequency of oscillation of said oscillator; circuit means connecting the output of said oscillator to the input of said mixing circuit whereby the output of said mixing circuit is the beat frequency of said amplifier output and said oscillator output; each of said tuning elements comprising a rotor, a two conductor transmission line coiled on said rotor with the opposite sides of the transmission line and alternate convolutions of the coil being formed by different conductors, electrically connecting means for terminating the transmission line as a balanced line of the element comprising a pair of fingers connected together and each engaging the opposite sides of the transmission line, said electrically conducting means being movable along the transmission line to vary the effective length thereof; said third tuning element including a third finger connected to the said electrically conducting means thereof for unbalancing said third transmission line tuning element and causing said third transmission line tuning element to operate as a ¾ wave length line, said third transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range and said first and second tuning elements operating as ¼ wave length lines to receive frequencies in the first range and as ¾ wave length lines to receive frequencies in the second range, and means interconnecting the rotors of said lines for rotation to move said conducting means for terminating the lines in a predetermined relation to maintain a predetermined intermediate frequency at the output of said mixing circuit throughout the range of frequencies to be received.

9. An apparatus of the character described for receiving radio frequency oscillations within a first frequency range and within a second frequency range of higher frequencies than the first range comprising a radio frequency amplifier; a mixing circuit; a local oscillator; tuned circuit means including a first transmission line tuning element for connecting a radio frequency signal to the input of said amplifier; tuned circuit means including a second transmission line tuning element for coupling the output of said amplifier to the input of said mixer; a third transmission line tuning element connected into the tuning circuit of said oscillator to determine the frequency of oscillation of said oscillator; circuit means connecting the output of said oscillator to the input of said mixing circuit whereby the output of said mixing circuit is the beat frequency of said amplifier output and said oscillator output; each of said tuning elements comprising a coiled two conductor transmission line with the opposite sides of the transmission line and adjacent convolutions of the coil being formed by different conductors, and electrically connecting means for terminating the transmission line as a balanced line connected between the opposite sides of the transmission line and movable therealong to vary the effective length of said line; the transmission lines of said first and second tuning elements being tapered helixes, the electrically conductive means of said third transmission line tuning element including means for terminating the transmission line thereof in an unbalanced condition to cause said third transmission line tuning element to operate as a ¾ wave length line, said third transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range and said first and second tuning elements operating as ¼ wave length lines to receive frequencies in the first range and as ¾ wave length lines to receive frequencies in the second range, and means ganging said movable electrically conducting means of said lines for movement in a predetermined relation to maintain a predetermined intermediate frequency at the output of said mixing circuit throughout the range of frequencies to be received.

10. An apparatus of the character described for receiving radio frequency oscillations within a first frequency range and within a second frequency range of higher frequencies than the first range comprising a radio frequency amplifier; a mixing circuit; a local oscillator; tuned circuit means including a first transmission line tuning element for connecting a radio frequency signal to the input of said amplifier; tuned circuit means including a second transmission line tuning element for coupling the output of said amplifier to the input of said mixer; a third transmission line tuning element connected into the tuning circuit of said oscillator to determine the frequency of oscillation of said oscillator; circuit means connecting the output of said oscillator to the input of said mixing circuit whereby the output of said mixing circuit is the beat frequency of said amplifier output and said oscillator output; each of said tuning elements comprising a rotor having coiled thereon a two conductor transmission line with the opposite sides of the transmission line and adjacent convolutions of the coil being formed by different conductors, and first short-circuit means for terminating the line as a balanced line connected between the opposite sides of the line and movable therealong upon the rotation of the rotor to vary the effective length of the line; said third tuning element including second short-circuiting means connected to the first short-circuiting means to unbalance the transmission line thereof, said third transmission line tuning element operating as a ¼ wave length line when balanced to tune said oscillator to the proper frequency when said apparatus is to receive signals within said first range and as a ¾ wave length line when unbalanced to tune said oscillator to the proper frequency when said apparatus is to receive a signal having a frequency in the higher range and said first and second tuning elements operating as ¼ wave length lines to receive frequencies in the first range and as ¾ wave length lines to receive frequencies in the second range; and means interconnecting said rotors to cause the short-circuiting means of said lines to move in a predetermined relation upon the rotation of said rotors to maintain a predetermined intermediate frequency at the output of said mixing circuit throughout the range of frequencies to be received, said first and second tuning elements having tapered rotors to facilitate tracking with said third tuning element.

References Cited in the file of this patent

UNITED STATES PATENTS

| | | |
|---|---|---|
| 2,126,541 | De Forest | Aug. 9, 1938 |
| 2,265,833 | Fritz | Dec. 9, 1941 |
| 2,292,254 | Van Beuren | Aug. 4, 1942 |
| 2,408,896 | Turner | Oct. 8, 1946 |
| 2,446,003 | Gardiner | July 27, 1948 |
| 2,505,572 | Oueracker | Apr. 25, 1950 |

FOREIGN PATENTS

| | | |
|---|---|---|
| 897,086 | France | Mar. 12, 1945 |